(12) United States Patent
Lee et al.

(10) Patent No.: US 9,315,627 B2
(45) Date of Patent: Apr. 19, 2016

(54) POLYAMIDE ESTER RESIN, METHOD OF PREPARING THE SAME, AND MOLDED ARTICLE INCLUDING THE SAME

(71) Applicant: Cheil Industries Inc., Gumi-si (KR)

(72) Inventors: Eun Ju Lee, Uiwang-si (KR); So Young Kwon, Uiwang-si (KR); Joon Sung Kim, Uiwang-si (KR); Sang Kyun Im, Uiwang-si (KR); Sung Chul Choi, Uiwang-si (KR); Ki Yon Lee, Uiwang-si (KR); Suk Min Jun, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 67 days.

(21) Appl. No.: 14/103,875

(22) Filed: Dec. 12, 2013

(65) Prior Publication Data

US 2014/0357832 A1 Dec. 4, 2014

(30) Foreign Application Priority Data

May 31, 2013 (KR) ........................ 10-2013-0062737

(51) Int. Cl.
*C08G 69/44* (2006.01)
*C08L 77/12* (2006.01)
*H01L 33/60* (2010.01)

(52) U.S. Cl.
CPC ................. *C08G 69/44* (2013.01); *C08L 77/12* (2013.01); *H01L 33/60* (2013.01)

(58) Field of Classification Search
CPC ......... C08G 69/44; C08L 77/12; H01L 33/60; C09J 177/12; C09D 177/12
See application file for complete search history.

(56) References Cited

U.S. PATENT DOCUMENTS

| 4,101,524 | A | 7/1978 | Burzin et al. |
| 4,942,087 | A | 7/1990 | Motooka et al. |
| 5,670,608 | A * | 9/1997 | Oka et al. ...................... 528/322 |
| 5,672,676 | A | 9/1997 | Turner |
| 2002/0049285 | A1 | 4/2002 | Abe |
| 2009/0029154 | A1 | 1/2009 | Hala et al. |
| 2009/0227760 | A1 * | 9/2009 | Warren et al. ................. 528/324 |

FOREIGN PATENT DOCUMENTS

| CN | 101353476 A | 1/2009 |
| TW | 553979 B | 9/2003 |
| TW | I297017 B | 5/2008 |

OTHER PUBLICATIONS

Office Action in counterpart Taiwanese Application No. 102145998 dated Feb. 4, 2015, pp. 1-5.
Office Action in counterpart Korean Application No. 10-2013-0062737 dated Sep. 11, 2015, pp. 1-5.

* cited by examiner

*Primary Examiner* — Gregory Listvoyb
(74) *Attorney, Agent, or Firm* — Additon, Higgins & Pendleton, P.A.

(57) ABSTRACT

A polyamide ester resin is a polymer of: a dicarboxylic acid; a diamine; and a linear aliphatic diol, wherein, based on a total amount of the diamine and the linear aliphatic diol, the diamine is present in an amount of about 75 mol % to about 99 mol % and the linear aliphatic diol is present in an amount of about 1 mol % to about 25 mol %, and wherein the polyamide ester resin has a melting point (Tm) from about 280° C. to about 320° C. and a crystallization temperature (Tc) from about 260° C. to about 290° C. The polyamide ester resin can exhibit excellent heat resistance, discoloration resistance, and moldability.

12 Claims, No Drawings

POLYAMIDE ESTER RESIN, METHOD OF PREPARING THE SAME, AND MOLDED ARTICLE INCLUDING THE SAME

CROSS-REFERENCE TO RELATED APPLICATION

This application claims priority under 35 USC Section 119 to and the benefit of Korean Patent Application No. 10-2013-0062737, filed May 31, 2013, the entire disclosure of which is incorporated herein by reference.

FIELD OF THE INVENTION

The present invention relates to a polyamide ester resin, a method of preparing the same, and a molded article including the same.

BACKGROUND OF THE INVENTION

High heat resistant nylon can be obtained by polycondensation of aromatic dicarboxylic acids or aromatic diamines. High heat resistant nylon may have a semi-aromatic structure and a semi-crystalline structure, and may be used in various fields requiring high heat resistance due to its significantly higher heat resistance as compared to general nylon.

Examples of typical high heat resistant nylon include PA4T, PA6T, PA9T, PA10T, PA11T, PA12T, and the like. High heat resistant nylon using $C_9$ or longer chain diamines may directly employ a homopolymer, or may employ a copolymerized polymer using a comonomer (dicarboxylic acid or diamine).

Generally, PA4T and PA6T cannot be processed due to an extremely high melting point of the homopolymer. Melt processability thereof can be improved by introduction of a large amount of (tens of %) comonomers. For PA6T, adipic acid, isophthalic acid or the like is widely used as a comonomer, and short-chain or long-chain aliphatic diamine, alicyclic diamine, branched chain aliphatic diamine, short-chain or long-chain aliphatic dicarboxylic acid, alicyclic dicarboxylic acid, branched chain aliphatic dicarboxylic acid, and the like may be used.

In high heat resistant nylon products for LED reflectors which require excellent optical properties and discoloration resistance, alicyclic dicarboxylic acid may be used instead of aromatic dicarboxylic acid in order to produce products exhibiting excellent optical/thermal properties, or a monomer capable of increasing a glass transition temperature (Tg) may be copolymerized in order to prevent deterioration of properties of nylon products at high temperature. However, such copolymerization cannot prevent nylon from suffering inherent discoloration when exposed to air at high temperature.

Due to such drawbacks, in products requiring discoloration resistance, high heat resistant polyester products may be used instead of high heat resistant nylon. However, high heat resistant polyester products generally exhibit inferior heat resistance as compared to high heat resistant nylon, and have drawbacks of poor hydrolyzability and moldability under humid conditions despite excellent discoloration resistance.

Thus, there is a need for a novel polyamide ester resin (amide-ester hybrid resin), which exhibits superior properties as compared to existing high heat resistant nylon products in terms of heat resistance, discoloration resistance and the like, and which have improved moldability.

SUMMARY OF THE INVENTION

The present invention provides a polyamide ester resin, which can exhibit excellent properties in terms of heat resistance, discoloration resistance and/or moldability while ensuring an excellent balance therebetween, a method of preparing the same, and a molded article including the same.

The polyamide ester resin is a polymer of: a dicarboxylic acid; a diamine; and a linear aliphatic diol, wherein, based on a total amount of the diamine and the linear aliphatic diol, the diamine is present in an amount of about 75 mol % to about 99 mol % and the linear aliphatic diol is present in an amount of about 1 mol % to about 25 mol %, and wherein the polyamide ester resin has a melting point (Tm) from about 280° C. to about 320° C. and a crystallization temperature (Tc) from about 260° C. to about 290° C.

In one embodiment, the dicarboxylic acid may include at least one of $C_8$ to $C_{20}$ aromatic dicarboxylic acids and $C_8$ to $C_{20}$ alicyclic dicarboxylic acids.

In one embodiment, the diamine may include at least one of $C_4$ to $C_{20}$ aliphatic diamines.

In one embodiment, the linear aliphatic diol may include at least one of $C_2$ to $C_{20}$ linear aliphatic diols.

In one embodiment, the polyamide ester resin may have a glass transition temperature (Tg) from about 80° C. to about 120° C.

In one embodiment, the polyamide ester resin may have an intrinsic viscosity from about 0.5 dL/g to about 1.0 dL/g.

In one embodiment, the polyamide ester resin may have a color change (ΔE) from about 5 to about 10 as calculated by Equation 1:

$$\text{Color change}(\Delta E) = \sqrt{(\Delta L^*)^2 + (\Delta a^*)^2 + (\Delta b^*)^2} \quad (1),$$

wherein ΔL* is a difference between L* values before and after scorch testing, Δa* is a difference between a* values before and after scorch testing, and Δb* is a difference between b* values before and after scorch testing, in which about 1 g to about 3 g of the polyamide ester resin is left in a convection oven at about 200° C. for about 1 hour.

In one embodiment, the polyamide ester resin may have a terminal group encapsulated with an end capping agent including at least one of an aliphatic carboxylic acid and an aromatic carboxylic acid.

The end capping agent may include at least one of acetic acid, propionic acid, butyric acid, valeric acid, caproic acid, caprylic acid, lauric acid, tridecanoic acid, myristic acid, palmitic acid, stearic acid, pivalic acid, isobutyric acid, benzoic acid, toluic acid, α-naphthalene carboxylic acid, β-naphthalene carboxylic acid, and methylnaphthalene carboxylic acid.

The present invention also relates to a method of preparing the polyamide ester resin. The method includes: polymerizing a dicarboxylic acid, a diamine and a linear aliphatic diol, wherein, based on a total amount of the diamine and the linear aliphatic diol, the diamine is present in an amount of about 75 mol % to about 99 mol % and the linear aliphatic diol is present in an amount of about 1 mol % to about 25 mol %, and wherein the polyamide ester resin has a melting point (Tm) from about 280° C. to about 320° C. and a crystallization temperature (Tc) from about 260° C. to about 290°.

The present invention further relates to a molded article including the polyamide ester resin. In one embodiment, the molded article may be an LED reflector.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

According to the present invention, a polyamide ester resin is a polymer of: (A) a dicarboxylic acid; (B) a diamine; and (C) a linear aliphatic diol. The polyamide ester resin has a structure in which a dicarboxylic acid moiety derived from the (A) dicarboxylic acid, a diamine moiety derived from the (B) diamine and a linear aliphatic diol moiety derived from the (C) linear aliphatic diol are repeated, wherein, based on a total amount of the (B) diamine and the (C) linear aliphatic diol, the (B) diamine is present in an amount of about 75 mol % to about 99 mol % and the (C) linear aliphatic diol is present in an amount of about 1 mol % to about 25 mol %, and wherein the polyamide ester resin has a melting point (Tm) from about 280° C. to about 320° C. and a crystallization temperature (Tc) from about 260° C. to about 290°.

As used herein, "dicarboxylic acid" includes dicarboxylic acid, esters thereof ($C_1$ to $C_4$ lower alkyl esters such as monomethyl, monoethyl, dimethyl, diethyl, dibutyl esters, and the like), acid anhydrides thereof, and the like, and combinations thereof, and forms dicarboxylic acid moieties formed via reaction with a diamine and a linear aliphatic diol. In addition, as used herein, the dicarboxylic acid, diamine and linear aliphatic diol moieties mean residues remaining after removal of hydrogen atoms, hydroxyl groups or alkoxy groups when dicarboxylic acids, diamines and linear aliphatic diols are polymerized.

(A) Dicarboxylic Acid

According to the invention, the (A) dicarboxylic acid may include dicarboxylic acids used in typical polyamide resins, for example, $C_8$ to $C_{20}$ aromatic dicarboxylic acids, $C_8$ to $C_{20}$ cyclic (aliphatic) dicarboxylic acids, and the like, and mixtures thereof.

The aromatic dicarboxylic acid can be included in the polyamide ester resin to impart high heat resistance, and examples thereof may include without limitation terephthalic acid, isophthalic acid, 2,6-naphthalene dicarboxylic acid, 2,7-naphthalene dicarboxylic acid, 1,4-naphthalene dicarboxylic acid, 1,4-phenylene dioxydiphenolic acid, 1,3-phenylene dioxydiacetic acid, diphenic acid, 4,4'-oxybis(benzoic acid), diphenylmethane-4,4'-dicarboxylic acid, diphenylsulfone-4,4'-dicarboxylic acid, 4,4'-diphenyldicarboxylic acid, and the like, and mixtures thereof. For example, the aromatic dicarboxylic acid may include terephthalic acid, isophthalic acid, or a mixture thereof. In exemplary embodiments, the aromatic dicarboxylic acid may include terephthalic acid, or a mixture of terephthalic acid and isophthalic acid.

Examples of the cyclic dicarboxylic acid include without limitation 2-cyclohexene-1,4-dicarboxylic acid, cyclohexane-1,1-dicarboxylic acid, trans-1,2-cyclohexane-dicarboxylic acid, 1,4-cyclohexane-dicarboxylic acid, 1,3-cyclohexane-dicarboxylic acid, dimethylcyclohexane-1,4-dicarboxylate, and the like. These may be used alone or in combination thereof.

In one embodiment, when the aromatic dicarboxylic acid and the cyclic dicarboxylic acid are used in conjunction, the cyclic dicarboxylic acid may be present in an amount of about 0.01 parts by mole to about 50 parts by mole, for example, about 5 parts by mole to about 30 parts by mole, based on 100 parts by mole of the aromatic dicarboxylic acid. In some embodiments, the cyclic dicarboxylic acid can be used in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by mole. Further, according to some embodiments of the present invention, the amount of the cyclic dicarboxylic acid can be in a range from about any of the foregoing amounts to about any other of the foregoing amounts.

When the cyclic dicarboxylic acid is used in an amount within this range, the polyamide ester resin can exhibit excellent processability.

(B) Diamine

According to the invention, the (B) diamine is included in the polyamide ester resin to improve chemical resistance and moldability. The (B) diamine may include diamines used in typical polyamide ester resins, for example, $C_4$ to $C_{20}$ aliphatic diamines. Examples of the (B) diamine include without limitation: linear aliphatic diamines, such as 1,4-butanediamine, 1,5-pentanediamine, 1,6-hexanediamine (hexamethylene diamine), 1,7-heptanediamine, 1,8-octanediamine, 1,9-nonanediamine, 1,10-decanediamine, 1,12-dodecanediamine, 2-methyl-1,5-pentanediamine, 2,2,4-trimethyl-1,6-hexanediamine, 2,4,4-trimethyl-1,6-hexanediamine, 5-methyl-1,9-nonanediamine, 2,2-oxybis(ethylamine), bis(3-aminopropyl)ether, ethylene glycol bis(3-aminopropyl)ether (EGBA), 1,7-diamino-3,5-dioxoheptane, and the like and mixtures thereof. For example, the (B) diamine may be a $C_4$ to $C_{12}$ aliphatic diamine, such as 1,4-butanediamine, 1,6-hexanediamine, 1,10-decanediamine, 1,12-dodecanediamine, or a mixture thereof. In exemplary embodiments, the (B) diamine may include 1,6-hexanediamine, 1,10-decanediamine, 1,12-dodecanediamine, or a mixture thereof.

(C) Linear Aliphatic Diol

According to the invention, the (C) linear aliphatic diol is included in the polyamide ester resin to impart discoloration resistance. The (C) linear aliphatic diol may include $C_2$ to $C_{20}$, for example, $C_4$ to $C_{12}$, linear aliphatic diols. Examples of the (C) linear aliphatic diol include without limitation 1,2-ethanediol, 1,3-propanediol, 1,4-butanediol, 1,5-pentanediol, 1,6-hexanediol (hexamethylene diol), 1,7-heptanediol, 1,8-octanediol, 1,10-decanediol, 1,12-dodecanediol, 2-methyl-1,5-pentanediol, 2,2,4-trimethyl-1,6-hexanediol, 2,4,4-trimethyl-1,6-hexanediol, 5-methyl-1,9-nonanediol, and the like, and mixtures thereof. For example, the (C) linear aliphatic diol may include 1,4-butanediol, 1,6-hexanediol, 1,10-decanediol, 1,12-dodecanediol or a mixture thereof. In exemplary embodiments, the (C) linear aliphatic diol may include 1,6-hexanediol, 1,10-decanediol, 1,12-dodecanediol, or a mixture thereof.

According to the invention, in the polyamide ester resin, the (B) diamine may be present in an amount of about 75 mol % to about 99 mol %, for example, about 80 mol % to about 95 mol %, and as another example, about 82 mol % to about 95 mol %, and the (C) linear aliphatic diol may be present in an amount of about 1 mol % to about 25 mol %, for example, about 5 mol % to about 20 mol %, and as another example, about 5 mol % to about 18 mol %, each based on a total amount of the (B) diamine and the (C) linear aliphatic diol.

In some embodiments, the (B) diamine may be present in an amount of about 75, 76, 77, 78, 79, 80, 81, 82, 83, 84, 85, 86, 87, 88, 89, 90, 91, 92, 93, 94, 95, 96, 97, 98, or 99 mol %. Further, according to some embodiments of the present invention, the amount of the (B) diamine can be in a range from about any of the foregoing amounts to about any other of the foregoing amounts.

In some embodiments, the (C) linear aliphatic diol may be present in an amount of about 1, 2, 3, 4, 5, 6, 7, 8, 9, 10, 11, 12, 13, 14, 15, 16, 17, 18, 19, 20, 21, 22, 23, 24, or 25 mol %. Further, according to some embodiments of the present invention, the amount of the (C) linear aliphatic diol can be in a range from about any of the foregoing amounts to about any other of the foregoing amounts.

If the amount of the (B) diamine exceeds about 99 mol % or the amount of the (C) linear aliphatic diol is less than about 1 mol %, the polyamide ester resin can suffer from deterioration in discoloration resistance. If the amount of the (B) diamine is less than about 75 mol % or the amount of the (C) linear aliphatic diol exceeds about 25 mol %, the polyamide ester resin can suffer from deterioration of properties such as chemical resistance, processability, heat resistance and the like, due to significant decrease in melting and crystallization temperatures thereof.

In addition, a mole ratio (((B)+(C))/(A)) of the (B) diamine and the (C) linear aliphatic diol to the (A) aromatic dicarboxylic acid may range from about 0.9 to about 1.3, for example, from about 0.95 to about 1.25. Within this range, the polyamide ester resin can prevent deterioration of properties due to unreacted monomers and can exhibit excellent properties in terms of heat resistance, discoloration resistance, and moldability.

According to the invention, the polyamide ester resin may have a terminal group encapsulated with an end capping agent. Examples of the end capping group may include without limitation aliphatic carboxylic acids, aromatic carboxylic acids, and the like, and mixtures thereof. Examples of the end capping agent may include without limitation acetic acid, propionic acid, butyric acid, valeric acid, caproic acid, caprylic acid, lauric acid, tridecanoic acid, myristic acid, palmitic acid, stearic acid, pivalic acid, isobutyric acid, benzoic acid, toluic acid, α-naphthalene carboxylic acid, β-naphthalene carboxylic acid, methylnaphthalene carboxylic acid, and the like, and mixtures thereof. The end capping agent is optionally present in an amount of about 5 parts by mole or less, for example, about 0.01 parts by mole to about 3 parts by mole, based on 100 parts by mole of all monomers, ((A)+(B)+(C)).

According to the invention, the polyamide ester resin can have a melting point (Tm) from about 280° C. to about 320° C., for example, from about 290° C. to about 310° C. If the melting point of the polyamide ester resin is less than about 280° C., the polyamide ester resin can exhibit deteriorated heat resistance, and if the melting point of the polyamide ester resin exceeds about 320° C., the polyamide ester resin can have poor moldability (processability).

In addition, the polyamide ester resin can have a crystallization temperature (Tc) from about 260° C. to about 290° C., for example, from about 270° C. to about 280° C. If the crystallization temperature of the polyamide ester resin is less than about 260° C., the resin can suffer from decrease in crystallization speed and can have deteriorated moldability. If the crystallization temperature of the polyamide ester resin exceeds about 290° C., the moldability of the polyamide ester resin can be deteriorated such that injection molding conditions can become complicated and injection molding of small components can become difficult.

Further, the polyamide ester resin may have a ratio (Tm/Tc) of the melting point (Tm) to the crystallization temperature (Tc) from about 1.07 to about 1.25, for example, from about 1.10 to about 1.15. Within this range, the polyamide ester resin can exhibit excellent moldability.

The polyamide ester resin may have a glass transition temperature (Tg) from about 80° C. to about 120° C., for example, from about 85° C. to about 110° C. Within this range, the polyamide ester resin can exhibit excellent heat resistance.

The polyamide ester resin may have an intrinsic viscosity from about 0.5 dL/g to about 1.0 dL/g, for example, from about 0.8 dL/g to about 1.0 dL/g, as measured using a Ubbelohde viscometer in m-cresol solution at 25° C. Within this range, the polyamide ester resin can exhibit excellent properties in terms of heat resistance, discoloration resistance, moldability, and the like.

Color space values (L*, a*, b*) of the prepared polyamide ester resin were initially measured in accordance with ASTM D1209, and measured again in the same manner after scorch testing in which about 1 g to about 3 g of the polyamide ester resin was left in a convection oven at about 200° C. for about 1 hour, thereby evaluating discoloration resistance through color change (ΔE) according to Equation 1:

$$\text{Color change}(\Delta E) = \sqrt{(\Delta L^*)^2 + (\Delta a^*)^2 + (\Delta b^*)^2} \quad (1),$$

wherein ΔL* is a difference between L* values before and after scorch testing, Δa* is a difference between a* values before and after scorch testing, and Δb* is a difference between b* values before and after scorch testing.

The polyamide ester resin may have a color change (ΔE) from about 5 to about 10, for example, about 5 to about 8. Within this range, the polyamide ester resin can exhibit excellent discoloration resistance.

According to the invention, a method of preparing the polyamide ester resin includes: polymerizing the (A) dicarboxylic acid, the (B) diamine and the (C) linear aliphatic diol, wherein the prepared polyamide ester resin has a melting point (Tm) from about 280° C. to about 320° C. and a crystallization temperature (Tc) from about 260° C. to about 290° C.

In one embodiment, (co)polymerization may be performed using a typical polymerization method, for example, melt polymerization.

The polymerization temperature may range from about 80° C. to about 300° C., for example, from about 80° C. to about 280° C., and polymerization pressure may range from about 10 kgf/cm² to about 40 kgf/cm², without being limited thereto.

In one embodiment, the polyamide ester resin may be obtained by a process including: placing the (A) dicarboxylic acid, the (B) diamine, the (C) linear aliphatic diol, a catalyst and water in a reactor and stirring at about 80° C. to about 150° C. for about 0.5 hours to about 2 hours, maintaining the mixture at about 200° C. to about 280° C. under a pressure of about 10 kgf/cm² to about 40 kgf/cm² for about 2 hours to about 4 hours, lowering the pressure to about 10 kgf/cm² to about 20 kgf/cm² to perform (copolymerization) reaction of the (A) dicarboxylic acid, the (B) diamine and the (C) linear aliphatic diol for about 1 hour to about 3 hours, and performing solid state polymerization of the obtained polyamide ester at a temperature between a glass transition temperature (Tg) and a melting point (Tm) thereof in a vacuum for about 10 minutes to about 30 minutes.

The catalyst may be a phosphorus catalyst. Examples of the phosphorous catalyst may include without limitation phosphoric acid, phosphorous acid, hypophosphorous acid, salts thereof, derivatives thereof, and the like, and combinations thereof. In exemplary embodiments, the catalyst may include phosphoric acid, phosphorous acid, hypophosphorous acid, sodium hypophosphate, and/or sodium hypophosphinate.

The catalyst is optionally present in an amount of about 3 parts by weight or less, for example, about 0.001 parts by weight to about 1 part by weight, and as another example about 0.01 parts by weight to about 0.5 parts by weight, based on about 100 parts by weight of all of the monomers, ((A)+(B)+(C)), without being limited thereto.

In addition, in the preparation method, the end capping agent may be used in an amount as described above, and viscosity of the synthesized polyamide ester resin may be adjusted by adjusting the amount of the end capping agent.

According to the present invention, a molded article including the polyamide ester resin may be prepared. For example, a crystalline polyamide ester resin may be used for the preparation of LED reflectors and the like requiring heat resistance, light resistance, discoloration resistance, and moldability, without being limited thereto. The molded article can be easily formed by those skilled in the art.

Next, the present invention will be explained in more detail with reference to the following examples. However, it should be understood that these examples are provided for illustration only and are not to be in any way construed as limiting the present invention.

EXAMPLES

Example 1

According to the composition as listed in Table 1, 49.84 g (0.300 mol) of terephthalic acid (TPA) as the dicarboxylic acid, 49.85 g (0.289 mol) of 1,10-decanediamine (DDA) as the diamine, 1.80 g (0.015 mol) of 1,6-hexanediol (HDO) as the diol, 1.01 g of benzoic acid as an end capping agent, 0.10 g of sodium hypophosphinate as a catalyst, and 38.5 ml of water are placed in a 2 L autoclave, which in turn is filled with nitrogen. Next, after stirring the components at 130° C. for 60 minutes, the mixture is heated to 230° C. for 2 hours, and left for 3 hours at a pressure of 25 kgf/cm$^2$, followed by decreasing the pressure to 15 kgf/cm$^2$ and reacting the resulting material for 1 hour, thereby preparing a polyamide ester pre-copolymer. Solid state polymerization of the prepared polyamide ester pre-copolymer is performed at 230° C. for 6 hours, thereby obtaining a polyamide ester resin.

Example 2

According to the composition as listed in Table 1, a polyamide ester resin is obtained in the same manner as in Example 1 except that 41.98 g (0.244 mol) of 1,10-decanediamine (DDA) is used as the diamine instead of 49.85 g (0.289 mol) of 1,10-decanediamine (DDA), and 7.20 g (0.061 mol) of 1,6-hexanediol (HDO) is used as the diol instead of 1.80 g (0.015 mol) of 1,6-hexanediol (HDO).

Example 3

According to the composition as listed in Table 1, a polyamide ester resin is obtained in the same manner as in Example 1 except that 44.60 g (0.259 mol) of 1,10-decanediamine (DDA) is used as the diamine instead of 49.85 g (0.289 mol) of 1,10-decanediamine (DDA), and 5.40 g (0.046 mol) of 1,6-hexanediol (HDO) is used as the diol instead of 1.80 g (0.015 mol) of 1,6-hexanediol (HDO).

Example 4

According to the composition as listed in Table 1, a polyamide ester resin is obtained in the same manner as in Example 1 except that 44.60 g (0.259 mol) of 1,10-decanediamine (DDA) is used as the diamine instead of 49.85 g (0.289 mol) of 1,10-decanediamine (DDA), and 7.96 g (0.046 mol) of 1,10-decanediol (DDO) is used as the diol instead of 1.80 g (0.015 mol) of 1,6-hexanediol (HDO).

Comparative Example 1

According to the composition as listed in Table 2, a polyamide ester resin is obtained in the same manner as in Example 1 except that 52.21 g (0.302 mol) of 1,10-decanediamine (DDA) is used as the diamine instead of 49.85 g (0.289 mol) of 1,10-decanediamine (DDA), and 0.18 g (0.002 mol) of 1,6-hexanediol (HDO) is used as the diol instead of 1.80 g (0.015 mol) of 1,6-hexanediol (HDO).

Comparative Example 2

According to the composition as listed in Table 2, a polyamide ester resin is obtained in the same manner as in Example 1 except that 52.21 g (0.303 mol) of 1,10-decanediamine (DDA) is used as the diamine instead of 49.85 g (0.289 mol) of 1,10-decanediamine (DDA), and 0.27 g (0.002 mol) of 1,10-decanediol (DDO) is used as the diol instead of 1.80 g (0.015 mol) of 1,6-hexanediol (HDO).

Comparative Example 3

According to the composition as listed in Table 2, a polyamide ester resin is obtained in the same manner as in Example 1 except that 36.73 g (0.213 mol) of 1,10-decanediamine (DDA) is used as the diamine instead of 49.85 g (0.289 mol) of 1,10-decanediamine (DDA), and 10.80 g (0.091 mol) of 1,6-hexanediol (HDO) is used as the diol instead of 1.80 g (0.015 mol) of 1,6-hexanediol (HDO).

Comparative Example 4

According to the composition as listed in Table 2, a polyamide ester resin is obtained in the same manner as in Example 1 except that 36.73 g (0.213 mol) of 1,10-decanediamine (DDA) is used as the diamine instead of 49.85 g (0.289 mol) of 1,10-decanediamine (DDA), and 15.92 g (0.091 mol) of 1,10-decanediol (DDO) is used as the diol instead of 1.80 g (0.015 mol) of 1,6-hexanediol (HDO).

Comparative Example 5

According to the composition as listed in Table 2, a polyamide ester resin is obtained in the same manner as in Example 1 except that 52.47 g (0.305 mol) of 1,10-decanediamine (DDA) is used as the diamine instead of 49.85 g (0.289 mol) of 1,10-decanediamine (DDA), and that the diol is not used.

TABLE 1

| Monomer (mol %) | | Example | | | |
|---|---|---|---|---|---|
| | | 1 | 2 | 3 | 4 |
| Diacid | TPA | 100 | 100 | 100 | 100 |
| Diamine | DDA | 95 | 82 | 85 | 85 |
| Diol | HDO | 5 | 18 | 15 | — |
| | DDO | — | — | — | 15 |
| Mole ratio | [Diamine + Diol]/[Diacid] | 1.015 | 1.015 | 1.015 | 1.015 |

TABLE 2

| Monomer (mol %) | | Comparative Example | | | | |
|---|---|---|---|---|---|---|
| | | 1 | 2 | 3 | 4 | 5 |
| Diacid | TPA | 100 | 100 | 100 | 100 | 100 |
| Diamine | DBA | 99.5 | 99.5 | 70 | 70 | 100 |
| Diol | HDO | 0.5 | — | 30 | — | — |
| | DDO | — | 0.5 | — | 30 | — |
| Mole ratio | [Diamine + Diol]/[Diacid] | 1.015 | 1.015 | 1.015 | 1.015 | 1.015 |

Experimental Example

The polyamide ester resins prepared in Examples and Comparative Examples are evaluated with respect to melting point, crystallization temperature, glass transition temperature, intrinsic viscosity, and color change (ΔE) between before and after scorch testing by the following methods. Results are shown in Table 3.

Property Evaluation (1) Melting point, crystallization temperature and glass transition temperature (unit: ° C.): Melting point, crystallization temperature and glass transition temperature of each of the polyamide ester resins is measured using a Differential Scanning calorimeter (DCS). A Q20 tester (TA Instrument Inc.) is used as the DSC, and measurement is performed under a nitrogen atmosphere at a heating rate of 10° C./min and at a cooling rate of 10° C./min within a temperature range from 30° C. to 400° C. Here, the crystallization temperature is determined as a maximum point of an exothermic peak upon cooling, and the melting point is determined as a maximum point of an endothermic peak upon secondary heating. In addition, the glass transition temperature is determined as a temperature measured upon secondary heating.

(2) Intrinsic viscosity (unit: dL/g): Intrinsic viscosity is measured at 25° C. in m-cresol solution using an Ubbelohde viscometer.

(3) Discoloration resistance: Discoloration resistance is evaluated through color change (ΔE) between before and after scorch testing. Color space values (L*, a*, b*) of the prepared polyamide ester resin are measured using a colorimeter (CM-2600d, Konica Minolta Co., Ltd.) in accordance with ASTM D1209, and are measured again in the same manner after performing scorch testing in which 1 g to 3 g of the polyamide ester resin is left in a convection oven at 200° C. for 1 hour, thereby evaluating discoloration resistance thereof through color change (ΔE) according to Equation 1:

$$\text{Color change}(\Delta E) = \sqrt{(\Delta L^*)^2 + (\Delta a^*)^2 + (\Delta b^*)^2} \quad (1),$$

wherein ΔL* is a difference between L* values before and after scorch testing, Δa* is a difference between a* values before and after scorch testing, and Δb* is a difference between b* values before and after scorch testing.

In contrast, when the (C) linear aliphatic diol is not used (Comparative Example 5), or a small amount of the (C) linear aliphatic diol is used (Comparative Examples 1 and 2), it can be seen that the polyamide ester resins exhibit deteriorated discoloration resistance due to high color change values (ΔE) between before and after scorch testing, and thus are not suitable for application to LEDs and the like. In addition, when an excess of the (C) linear aliphatic diol is used (Comparative Examples 3 and 4), it can be seen that, despite low color change (ΔE) between before and after scorch testing, the polyamide ester resins have low melting point and low crystallization temperature, thus exhibiting poor processability and heat resistance.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A polyamide ester resin comprising a polymer of:
   a dicarboxylic acid comprising an aromatic dicarboxylic acid;
   a diamine comprising a linear aliphatic diamine; and
   a linear aliphatic diol,
   wherein, based on a total amount of the diamine and the linear aliphatic diol, the diamine is present in an amount of about 75 mol % to about 99 mol % and the linear aliphatic diol is present in an amount of about 1 mol % to about 25 mol %, and wherein the polyamide ester resin has a melting point (Tm) from about 280° C. to about 320° C. and a crystallization temperature (Tc) from about 260° C. to about 290° C.

2. The polyamide ester resin according to claim 1, wherein the dicarboxylic acid further comprises $C_8$ to $C_{20}$ alicyclic dicarboxylic acid.

TABLE 3

|  | Example | | | | Comparative Example | | | | |
| --- | --- | --- | --- | --- | --- | --- | --- | --- | --- |
|  | 1 | 2 | 3 | 4 | 1 | 2 | 3 | 4 | 5 |
| Melting point (° C.) | 310 | 297 | 302 | 301 | 312 | 312 | 278 | 277 | 312 |
| Crystallization temperature (° C.) | 275 | 268 | 272 | 273 | 280 | 281 | 255 | 254 | 283 |
| Glass transition temperature (° C.) | 113 | 90 | 94 | 96 | 118 | 117 | 80 | 79 | 120 |
| Intrinsic Viscosity (dL/g) | 0.84 | 0.84 | 0.85 | 0.87 | 0.89 | 0.85 | 0.84 | 0.87 | 0.86 |
| Color change (ΔE) | 7 | 5 | 6 | 5 | 12 | 12 | 5 | 5 | 12 |

In Table 3, it can be seen that the polyamide ester resins according to the present invention (Examples 1 to 4) exhibit excellent heat resistance since the resins have a glass transition temperature of 90° C. or more, and exhibit excellent moldability from the results of the melting point, crystallization temperature and the like. In addition, it can be seen that these polyamide ester resins exhibit excellent discoloration resistance from the results of color change (ΔE) between before and after scorch testing. That is, it can be seen that the polyamide ester resins exhibit an excellent balance between heat resistance, discoloration resistance and moldability.

3. The polyamide ester resin according to claim 1, wherein the diamine comprises at least one of $C_4$ to $C_{20}$ linear aliphatic diamines.

4. The polyamide ester resin according to claim 1, wherein the linear aliphatic diol comprises at least one of $C_2$ to $C_{20}$ linear aliphatic diols.

5. The polyamide ester resin according to claim 1, wherein the polyamide ester resin has a glass transition temperature (Tg) from about 80° C. to about 120° C.

6. The polyamide ester resin according to claim 1, wherein the polyamide ester resin has an intrinsic viscosity from about 0.5 dL/g to about 1.0 dL/g.

7. The polyamide ester resin according to claim 1, wherein the polyamide ester resin has a color change (ΔE) of from about 5 to about 10 as calculated by Equation 1:

$$\text{Color change } (\Delta E) = \sqrt{(\Delta L^*)^2 + (\Delta a^*)^2 + (\Delta b^*)^2} \quad (1)$$

wherein ΔL* is a difference between L* values before and after scorch testing, Δa* is a difference between a* values before and after scorch testing, and Δb* is a difference between b* values before and after scorch testing, in which about 1 g to about 3 g of the polyamide ester resin is left in a convection oven at about 200° C. for about 1 hour.

8. The polyamide ester resin according to claim 1, wherein the polyamide ester resin has a terminal group encapsulated with an end capping agent comprising an aliphatic carboxylic acid, an aromatic carboxylic acid, or a mixture thereof.

9. The polyamide ester resin according to claim 8, wherein the end capping agent comprises acetic acid, propionic acid, butyric acid, valeric acid, caproic acid, caprylic acid, lauric acid, tridecanoic acid, myristic acid, palmitic acid, stearic acid, pivalic acid, isobutyric acid, benzoic acid, toluic acid, α-naphthalene carboxylic acid, β-naphthalene carboxylic acid, methylnaphthalene carboxylic acid, or a mixture thereof.

10. A method of preparing a polyamide ester resin, comprising: polymerizing a dicarboxylic acid comprising an aromatic dicarboxylic acid, a diamine comprising a linear aliphatic diamine and a linear aliphatic diol,
wherein, based on a total amount of the diamine and the linear aliphatic diol, the diamine is present in an amount of about 75 mol % to about 99 mol % and the linear aliphatic diol is present in an amount of about 1 mol % to about 25 mol %, and
wherein the polyamide ester resin has a melting point (Tm) from about 280° C. to about 320° C. and a crystallization temperature (Tc) from about 260° C. to about 290°.

11. A molded article comprising the polyamide ester resin according to claim 1.

12. The molded article according to claim 11, wherein the molded article is an LED reflector.

* * * * *